(12) United States Patent
Hendrickson et al.

(10) Patent No.: US 8,577,987 B2
(45) Date of Patent: *Nov. 5, 2013

(54) INDEX RANK OPTIMIZATION SYSTEM AND METHOD

(75) Inventors: Benjamin Cappel Hendrickson, Bellevue, WA (US); Nicholas Stefan Gerner, Redmond, WA (US); S. Rand Mitchell Fishkin, Seattle, WA (US)

(73) Assignee: SEOmoz, Inc., Seattle, WA (US)

( * ) Notice: Subject to any disclaimer, the term of this patent is extended or adjusted under 35 U.S.C. 154(b) by 33 days.

This patent is subject to a terminal disclaimer.

(21) Appl. No.: 13/246,712

(22) Filed: Sep. 27, 2011

(65) Prior Publication Data
US 2012/0016963 A1    Jan. 19, 2012

Related U.S. Application Data

(63) Continuation of application No. 12/572,986, filed on Oct. 2, 2009.

(60) Provisional application No. 61/102,775, filed on Oct. 3, 2008, provisional application No. 61/102,785, filed on Oct. 3, 2008.

(51) Int. Cl.
*G06F 15/16* (2006.01)

(52) U.S. Cl.
USPC ........... 709/212; 709/201; 709/202; 709/232; 709/233

(58) Field of Classification Search
USPC .......................... 709/201, 217, 212, 232, 233
See application file for complete search history.

(56) References Cited

U.S. PATENT DOCUMENTS 7,779,001 B2 * 8/2010 Zeng et al. ..................... 707/726
2007/0016579 A1 * 1/2007 Kaul et al. ......................... 707/5

\* cited by examiner

*Primary Examiner* — Djenane Bayard
(74) *Attorney, Agent, or Firm* — ÆON Law; Adam L. K. Philipp

(57) ABSTRACT

An index ranking optimization system and method are provided herein.

15 Claims, 12 Drawing Sheets

INDEX RANK OPTIMIZATION SYSTEM AND METHOD

CROSS REFERENCE TO RELATED APPLICATIONS

This application is a continuation of U.S. patent application Ser. No. 12/572,986; titled "INDEX RANK OPTIMIZATION SYSTEM AND METHOD"; filed Oct. 2, 2009, naming inventors Benjamin Cappel Hendrickson, Nicholas Stefan Gerner, and S. Rand Mitchell Fishkin; and having application Ser. No. 12/572,986 claims the benefit of priority to U.S. Provisional Application No. 61/102,775, filed Oct. 3, 2008, titled "INDEX RANK OPTIMIZATION SYSTEM AND METHOD," naming inventors Benjamin Cappel Hendrickson, Nicholas Stefan Gerner, and S. Rand Mitchell Fishkin, and having application Ser. No. 12/572,986 also claims the benefit of priority to U.S. Provisional Application No. 61/102,785, filed Oct. 3, 2008, titled "WEB-SCALE DATA PROCESSING SYSTEM AND METHOD," naming inventors Benjamin Cappel Hendrickson and Nicholas Stefan Gerner, and having The above-cited applications are incorporated herein by reference in their entireties, for all purposes.

FIELD

The present disclosure relates to index rank optimization, and more particularly to a system and method for optimizing an opaque rank within a closed index.

BACKGROUND

The Internet is a worldwide, publicly accessible network of interconnected computer networks that transmit data by packet switching using the standard Internet Protocol (IP). The "network of networks" consists of millions of smaller domestic, academic, business, and government networks, which together enable various services, such as electronic mail, online chat, file transfer, and the interlinked web pages and other documents of the World Wide Web.

The World Wide Web (commonly shortened to the "Web") is a system of interlinked nodes accessed via the Internet. With a Web browser, a user may view nodes (e.g. Web pages) that may contain text, images, videos, and other multimedia. More pertinently, a node's content may also contain hyperlinks (or simply "links") that allow users to navigate from one node to another. A link is a reference or navigation element in the content of a source node that refers to, indicates, or "points" to a target node. In some cases, the target node may be the same as the source node (e.g., a link may target another location within the same node). In other cases, the target node may be a different node or a location within a different node.

Within an HTML document, links are typically specified using the <a> (anchor) elements, although there are many other types of links, including media (e.g. audio or video) embeds, javascript includes, ajax redirects, 301/302 HTTP redirects, meta refreshes, and the like. HTML code may specify some or all of five main characteristics of a link:
- target node (e.g. HTML "href" attribute, pointing to a target node);
- link label or "anchor text";
- link title (e.g., HTML "title" attribute);
- link browser window target (e.g., HTML "target" attribute, indicating which browser window to open the target node in);
- link class or link id (e.g., HTML "class" or "id" attributes).

For example, an HTML link specification may use the HTML element "a" with the attribute "href" and optionally also the attributes "title", "target", and "class" or "id":
<a href="URL" title="link title" target="link target" class="link class">anchor text</a>

A vast amount of information is available via the Internet, taking the form of Web pages, images, and other types of files. At the present time, "search engines" offer one of the primary resources used by Internet users to locate information of interest. Due at least to the staggering number of nodes on the Internet, search engines tend to operate largely algorithmically. Oversimplifying, search engines operate generally as follows. The search engine "crawls" the Web, storing data (on the search engine's own server or servers) from nodes it encounters. Using the stored data, a second program, known as an indexer, extracts various information about each node and its content, such as the words it contains and where these words are located. The indexer may also extract information about links contained in the node's content.

In recent years, the Web has grown so large that, as a general rule, creating such indexes involves so many resources that only very large, very well funded corporations have the resources to crawl and index the Web. Indeed, assuming that the average size of the HTML code of nodes on the Web is roughly 25 kilobytes per node, then 3.9 billion nodes (which is a small portion of what would be required to keep an up-to-date index of the Web) represent approximately 90 terabytes of data. Merely storing 90 terabytes of data, let alone processing it, would cost many thousands of dollars at current bulk-storage rates. Accordingly, indexing the Web has largely been the exclusive province of large, well-funded organizations.

Early versions of search algorithms relied on webmaster-provided information such as the keyword "meta" tag, which was intended to provide a guide to each node's content. But using such webmaster-provided metadata to index nodes could be unreliable because the webmaster's account of keywords in the meta tag were often not truly representative of the node's actual content. Inaccurate, incomplete, and inconsistent data in meta tags often caused nodes to rank highly for irrelevant searches. Moreover, Web content providers often manipulated a number of attributes within the HTML source of a node in an attempt to rank well in search results.

By relying so much on factors within a webmaster's control, early search engines were subject to abuse and ranking manipulation. Search engines responded by developing more complex ranking algorithms, taking into account additional factors that were more difficult for webmasters to manipulate. Larry Page and Sergey Brin, who went on to found Google Inc. of Menlo Park, Calif., developed one of the more successful of these complex ranking algorithms. Their algorithm, PageRank, estimates the likelihood that a given node will be reached by a web user who randomly surfs the web and follows links from one node to another. In effect, PageRank treats some links as being stronger than others, as nodes with a higher PageRank are more likely to be reached by the random surfer.

The original PageRank algorithm's rankings were more robust than earlier rankings based on webmaster-provided information. However, webmasters found methods to game the PageRank system, such as by creating "link farms"—or groups of web sites, each of which hyperlinks to every other site in the group—for the purpose of influencing search engine rankings. By 2007, search engines had incorporated a wide range of undisclosed factors in their ranking algorithms to reduce the impact of link manipulation. For example, Google may rank sites using more than 200 different signals.

At the current time, the three leading search engines are Google; Yahoo!, operated by Yahoo! Inc. of Sunnyvale, Calif.; and Microsoft's Bing (formerly Live Search), operated by Microsoft Corporation of Redmond, Wash. None of these search engines currently disclose the algorithms they use to rank nodes. Indeed, for most, if not all, major search engines, their index and rankings within that index remain a closely held trade secret.

While such secrecy may have made it harder for unscrupulous Web site operators to manipulate search results, it has also made it difficult for legitimate Web page providers to optimize their pages and sites so that they would organically rank highly in search results. The major search providers provide a few tools of use to Web operators desiring to optimize their rankings, including for example, Google Webmaster Tools, Bing Webmaster Tools, and Yahoo! Site Explorer. However, such tools leave much to be desired. As a general rule, current offerings may measure and publish certain metrics about pages, but not metrics about the individual links pointing to or from a page.

DESCRIPTION

Figure 1:
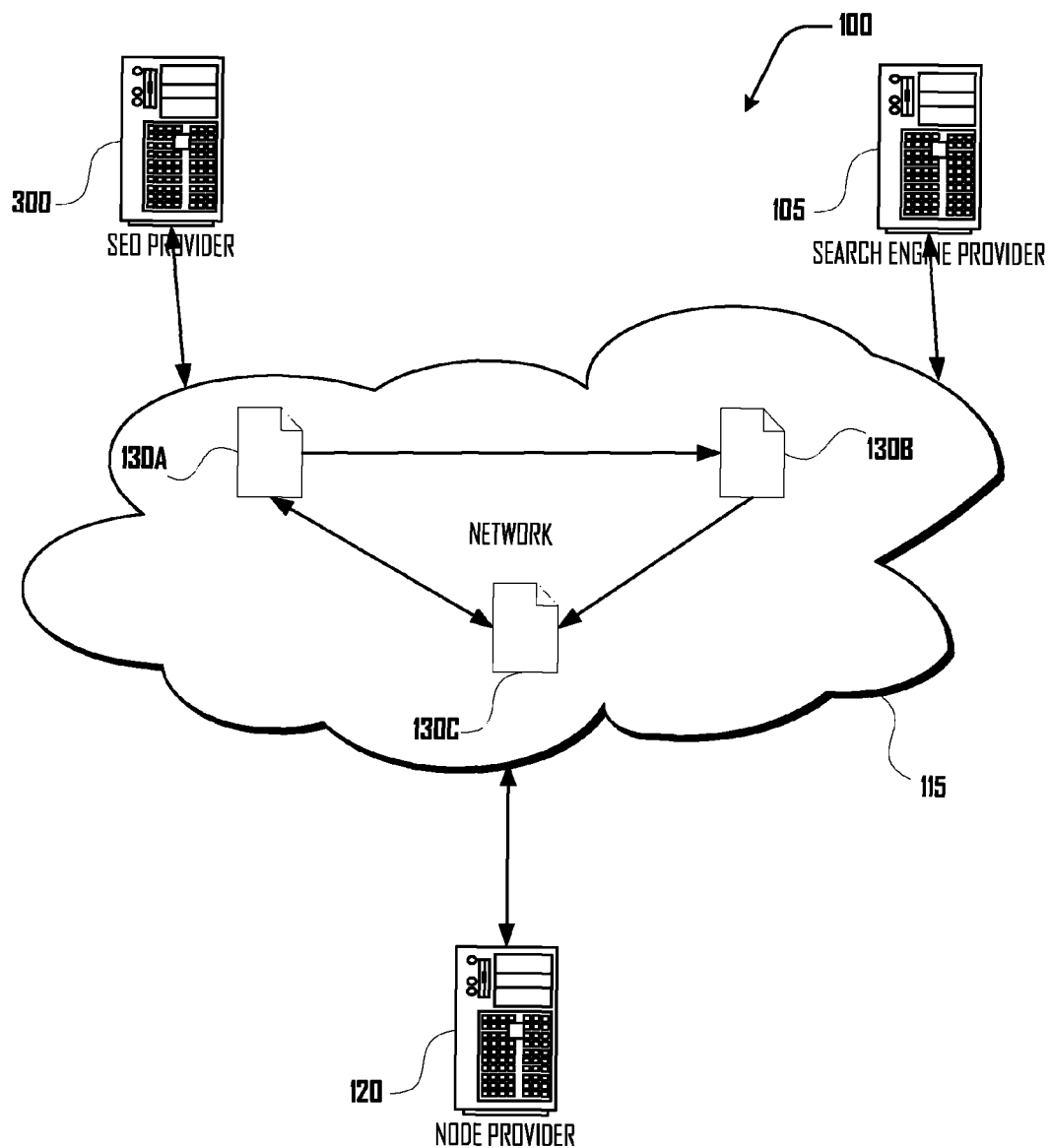
FIG. 1 is a system diagram of a number of devices in a network in accordance with one embodiment.

In accordance with various embodiments, an index-rank optimization system may include some or all of the following features:

- provide a comprehensive, ordered list of inbound links to a target node;
- provide one or more importance metrics associated with inbound links targeting a target node;
- track inbound links and/or the values of inbound links as they change over time;
- provide indications of types and/or genuses of inbound links (e.g., indicate whether an inbound link is an image, a 301 redirect, a meta refresh, from the same IP block, and the like);
- provide sorting and/or grouping of inbound links according to user-selectable criteria;
- provide an accurate count of inbound links targeting a target node;
- provide analysis of outbound links sourced from a target node (e.g., analyze whether an outbound link to an uncredible node adversely affects a the source node's ranking);
- indicate how fresh ranking and/or analysis information is (e.g., how recently the information was gathered and/or analyzed).

The detailed description that follows is represented largely in terms of processes and symbolic representations of operations by conventional computer components, including a processor, memory storage devices for the processor, connected display devices, and input devices. Furthermore, these processes and operations may utilize conventional computer components in a heterogeneous distributed computing environment, including remote file Servers, computer Servers and memory storage devices. Each of these conventional distributed computing components is accessible by the processor via a communication network.

Reference is now made in detail to the description of the embodiments as illustrated in the drawings. While embodiments are described in connection with the drawings and related descriptions, there is no intent to limit the scope to the embodiments disclosed herein. On the contrary, the intent is to cover all alternatives, modifications and equivalents. In alternate embodiments, additional devices, or combinations of illustrated devices, may be added to, or combined, without limiting the scope to the embodiments disclosed herein.

Web operators would like to know why their pages rank the way they do within a "closed" index, and optimization service providers would like to analyze the multiplicity of unknown factors that influence a node's "opaque" rank. As used herein, the term "closed index" refers to an index 1) that was generated according to one or more factors that are kept private by the index provider, and 2) to which an interested party (other than the index provider) does not have direct access. As used herein, the term "opaque rank" refers to a ranking metric that is substantially influenced by unknown or proprietary factors or attributes. For example, the proprietary indices maintained by current search engine operators are "closed" to outsiders because the contents of the indices may not be directly accessed, but must be inferred from results returned in response to a particular query. Similarly, the various ranks assigned to nodes by current search engine operators are "opaque" to outsiders because the attributes that influence the ranks are closely held secrets.

FIG. 1 illustrates a typical system wherein a node provider computing system 120, a search engine provider computing system 105, and a search engine optimization ("SEO") provider computing system 300 all connect to a network 115, on which exist several interlinked nodes 130A-C. In alternate embodiments, multiple providers and/or provider computing systems (e.g., 105, 120, 125) may act together or separately. Many more nodes 130 than are illustrated may be present. In many embodiments, the network 115 may be the Internet, and interlinked nodes 130A-C may comprise pages on the Web.

Figure 2:
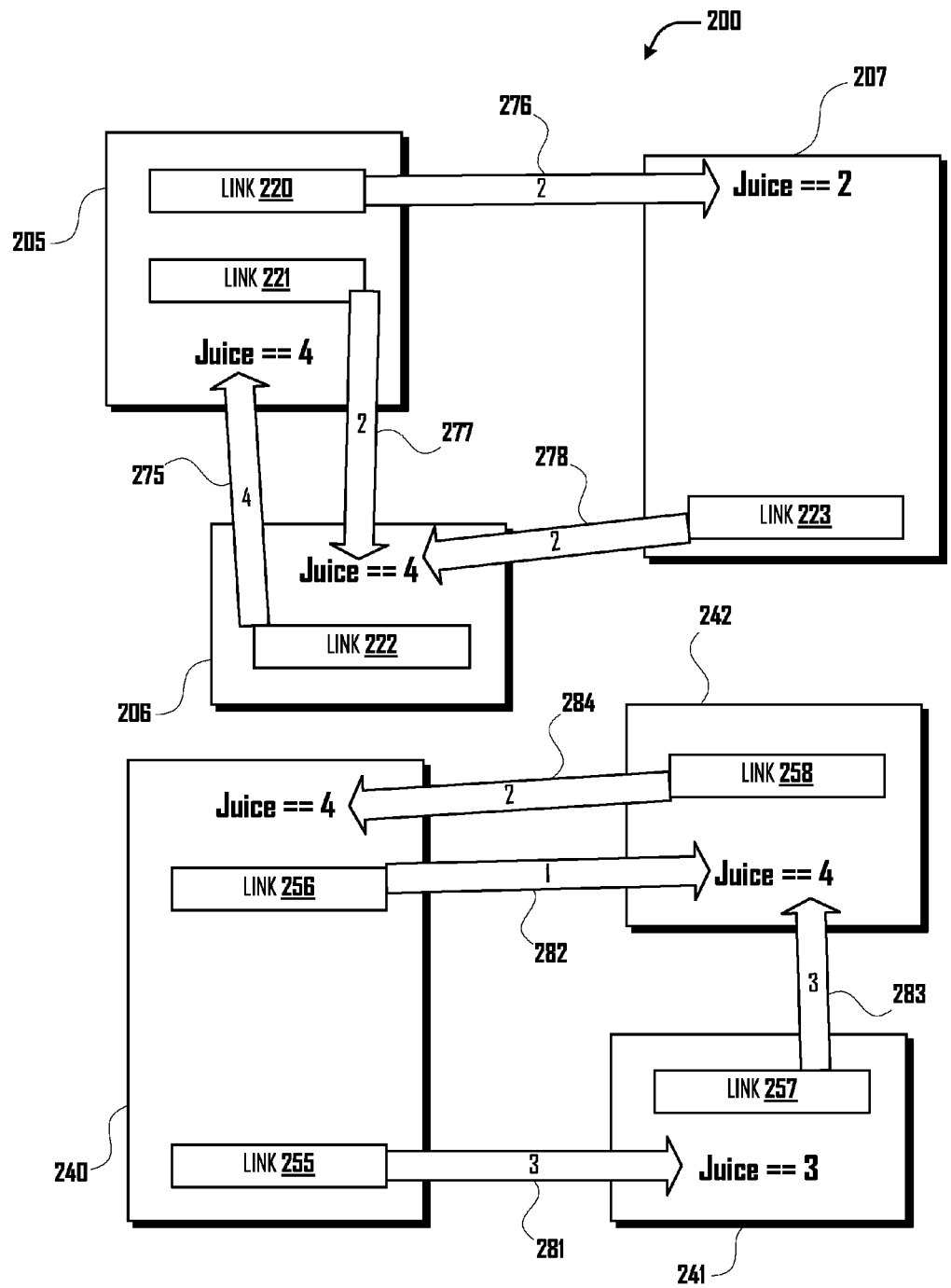
FIG. 2 is a diagram of juice distributions among linked nodes in accordance with various embodiments.

FIG. 2 illustrates a number of interlinked nodes 205-07, 240-42 and the flow of "juice" through links 220-23 and 255-58 from node to node. As used herein, "juice" refers to a measure of a node's "importance" or "authority" in general, outside the context of any specific search query. Often nodes with higher general link authority rank higher in search results than nodes with lower authority. As illustrated below, when determining juice values in a graph of interlinked nodes, every node has a "vote." A source node may be thought to "cast" its vote by linking out to target nodes, thereby "passing" a portion of the source's juice to the target. In most embodiments, every outbound link dilutes the node's vote, meaning that most links represent a fractional vote. Viewed another way, a link may be considered to be an endorsement of the target by the source node. Highly endorsed nodes may be considered more authoritative. In turn, authoritative nodes may be able to more authoritatively endorse nodes they link to. In a preferred embodiment, nodes may be ranked according to how much "juice" they can pass to other nodes. In many embodiments, a node's juice value may be mapped onto a logarithmic or other scale so that it may be conveniently and meaningfully displayed.

Referring to FIG. 2, node 205 is the source of two outbound links 220-21, and is the destination or target of inbound link 222 sourced from node 206. Node 206 is the source of one outbound link 222, and is the target of two inbound links 221, 223. Node 207 is the source of one outbound link 223, and is the target of one inbound link 220. Each node 205-07 has a determined amount of "juice," which passes from node to node via links 220-23. For example, node 205 has a juice value of "4," the entire portion 275 of which is passed to node 205 via inbound link 222 sourced from node 206. In turn, a first portion 276 of node 205's juice value is passed into node 207 via link 220; a second portion 277 of node 205's juice value is passed into node 206 via link 221. Node 207 has only one inbound link 220, so node 207 has a juice value that is equal to the link juice portion 276 passed via link 220. Node 206 is the target of two inbound links 221, 223. The sum of the juice value portions 277-78 passed via inbound links 221, 223 gives node 206 a juice value of 4.

Each of links 220-23 (among interlinked nodes 205-07) passes an equal portion of juice from its source node to its target node. In alternate embodiments, as illustrated in interlinked nodes 240-42, outbound links may pass differing portions of a source node's total juice value. In some cases, the amount of juice flowing into a node may not sum to the amount of juice flowing out of a node, although in many cases, the amount of juice flowing out will be some function of the juice flowing in.

Links 255-58 are similar to links 220-23. However, links 255-56 (sourced from node 240) pass unequal portions 281-82 of node 240's juice value to target nodes 241-42, respectively. In the illustrated example, a 75% portion 281 of node 240's juice passes via link 255 to node 241; only a 25% portion 282 of node 240's juice passes via link 256 to node 242. Accordingly, node 241 has a juice value of 3, the entire portion 283 of which passes via link 257 to node 242. As discussed further in regards to FIG. 6, there may be several reasons why link 256 may pass a smaller portion 282 of node 240's juice than the portion 281 passed via link 255. For example, link 256 may be coded such that it would not be visible when rendered to a standard Web browser. By contrast, link 255 may be coded such that it would be prominently displayed. These attributes may suggest that link 256 was placed on node 240 for purposes of manipulating search rankings; whereas link 255 may represent an implicit endorsement of node 241. Thus, because link 256 may be determined to be less important than link 255, link 256 may pass a smaller portion 282 of juice than the portion 281 passed by link 255.

Web providers may be able to use information about the flow of juice from node to node, as illustrated in FIG. 2, in order to help them optimize their Web pages and domains. To that end, an optimization provider computing system 300, as illustrated in FIG. 3, may compile and present such information.

In various embodiments, an optimization provider computing system 300 may provide a valuable service to Web node providers by computing and sharing juice values of target nodes, juice-passed values for links and/or collections of links (e.g., all inbound links from a particular domain), and link metadata (e.g., inbound link anchor text keywords and/or phrases, inbound link page title keywords and/or phrases). Such information about links may be provided to remote computing systems for the purpose of quantitatively analyzing the ranking ability of source nodes and to better characterize the link profile of a target node and/or domain; for purposes of internet marketing; and/or for other purposes.

Figure 3:
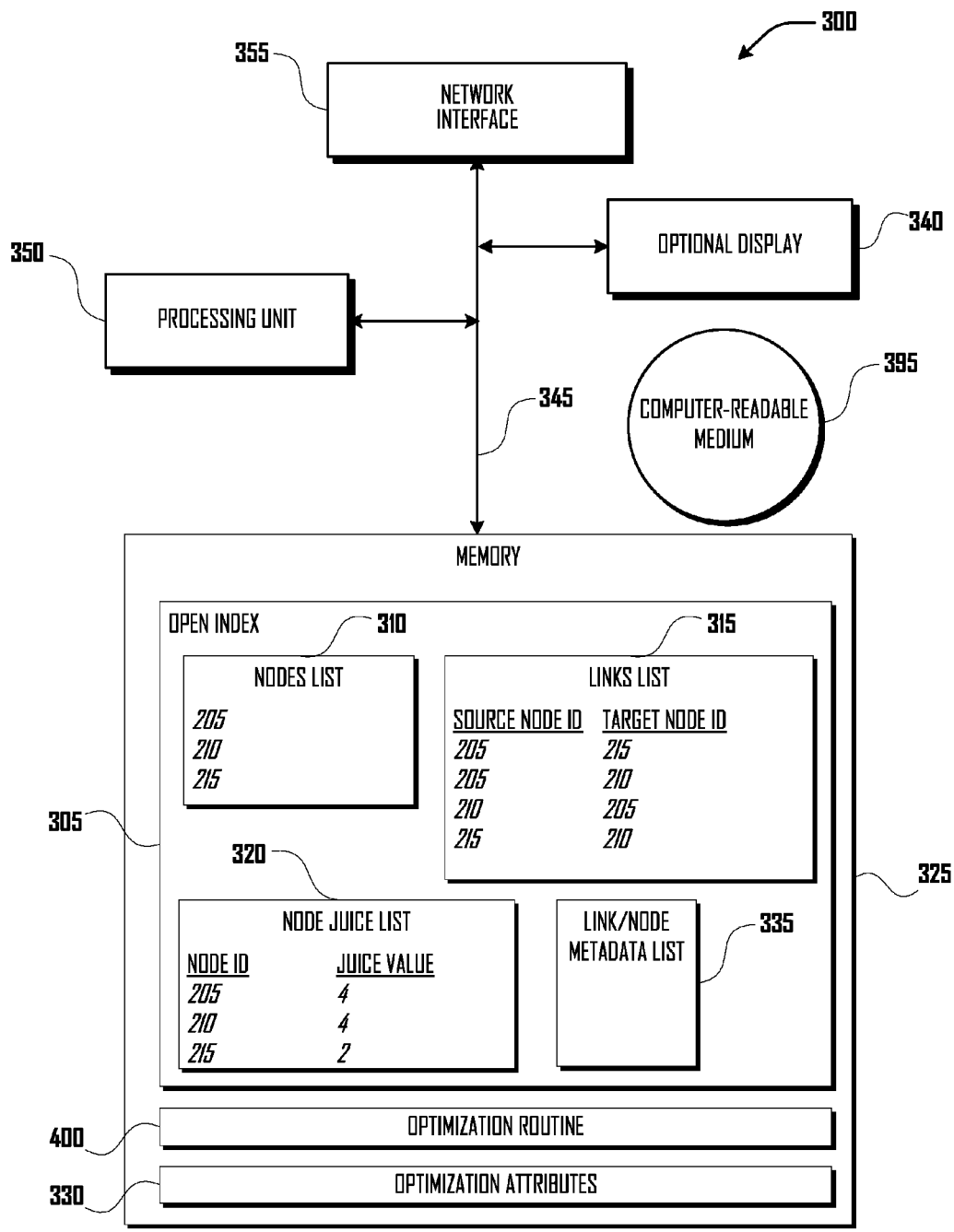
FIG. 3 is a diagram of an exemplary optimization provider in accordance with one embodiment.

FIG. 3 illustrates several components of an exemplary optimization provider computing system 300. In some embodiments, optimization provider computing system 300 may include many more components than those shown in FIG. 3. However, it is not necessary that all of these generally conventional components be shown in order to disclose an illustrative embodiment. As shown in FIG. 3, optimization provider computing system 300 includes a network interface 355 for connecting to network 115. Network interface 355 includes the necessary circuitry for such a connection and is constructed for use with an appropriate protocol.

Optimization provider computing system 300 also includes a processing unit 350, a memory 325, and an optional display 340, all interconnected, along with network interface 355, via bus 345. Memory 325 generally comprises a random access memory ("RAM"), a read only memory ("ROM"), one or more permanent mass storage devices, such as a disk drive, and/or a storage service operated by a distributed storage provider. In some embodiments, memory 325 may also comprise a local and/or remote database, database server, and/or database service. Similarly, processing unit 350 may be composed of numerous physical processors and/or it may comprise a service operated by a distributed processing facility.

Figure 4:
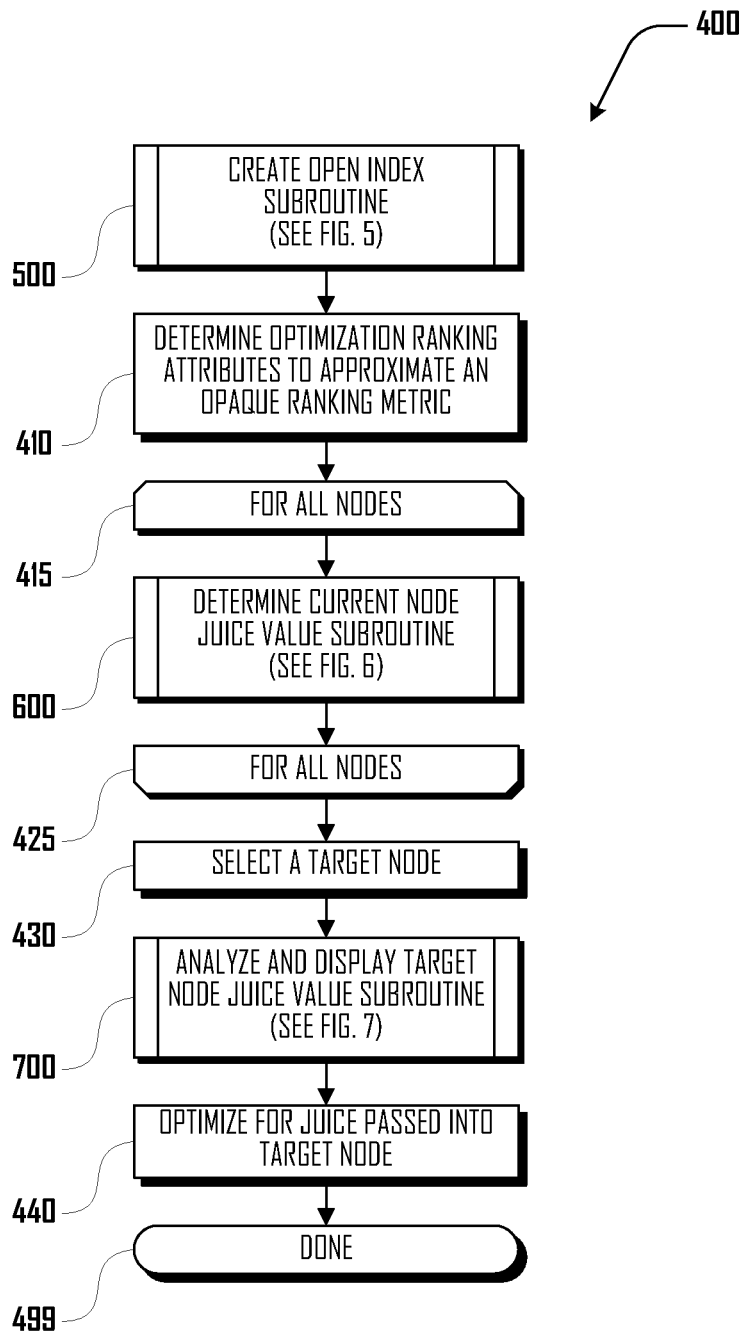
FIG. 4 is a flow diagram of an exemplary optimization routine in accordance with one embodiment.

Memory 325 stores program code for some or all of may an optimization routine 400, as illustrated in FIG. 4 and discussed below, and one or more optimization attributes 330, as discussed below. These and other software components may be loaded from a computer readable storage medium 395 into memory 325 of device 300 using a drive mechanism (not shown) associated with the computer readable storage medium 395, such as a floppy disc, tape, DVD/CD-ROM drive, memory card, and the like. In some embodiments, software components may also be loaded via the network interface 355 or other non-storage media.

Memory 325 may also contain an open index 305. In one embodiment, open index 305 comprises a nodes list 310, a links list 315, a node juice list 320, and a link and/or node metadata list 335. In alternate embodiments, more or fewer lists may be maintained, and/or similar data may be organized differently. The lists identified as making up the exemplary open index are presented for ease of comprehension. In practice, this data may be stored and represented to maximize storage and processing efficiency.

In some embodiments, optimization provider computing system 300 may comprise one or more devices such as that illustrated in FIG. 3. In other embodiments, optimization provider computing system 300 may comprise one or more virtualized servers, web services, and/or other computing devices.

Figure 5:
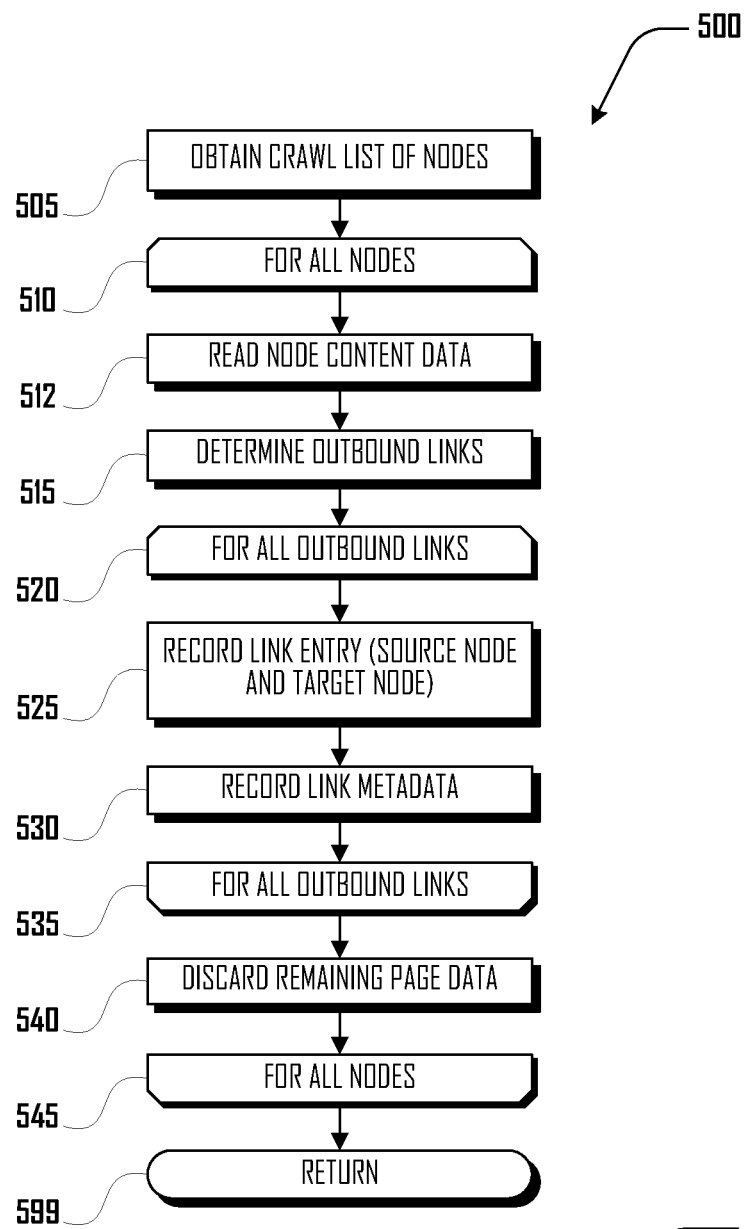
FIG. 5 is a flow diagram of an exemplary create open index subroutine in accordance with one embodiment.

FIG. 4 is a flow diagram of an exemplary optimization routine 400 in accordance with one embodiment. In create open index subroutine 500, an open index 305 is created, as illustrated in FIG. 5 and discussed below. In one embodiment, the open index may substantially approximate methods used by and/or results obtained by one or more closed indices, to the extent that such methods and results are known or may be inferred. In one embodiment, the open index comprises a list 310 of nodes or documents that are targeted or referred to by one or more links and a list 315 of links, identified at least by source and target. In various embodiments, the open index may comprise additional data, as discussed below in reference to FIG. 5. In some embodiments, instead of or in addition to creating a new open index via subroutine 500, routine 400 may obtain an existing index (not shown) for use as its open index.

In many embodiments, the open index includes a sufficient number of nodes and links that it may be treated as a representative sample of a web of interlinked nodes (e.g., the World Wide Web). In one embodiment, the open index may be a sufficiently representative sample if it includes at least 5% of the links and/or nodes in the web of interlinked nodes. In an exemplary embodiment, the open index (or nodes and links in the World Wide Web) may include billions of nodes and an order of magnitude mode links. In other embodiments, a smaller sample may be sufficiently representative. For example, when dealing with an interlinked web on the scale of the World Wide Web, an index containing as few as tens of millions of nodes may be sufficiently representative to provide meaningful results for certain applications.

In block 410, several optimization ranking attributes 330 are determined. In a preferred embodiment, such optimization ranking attributes 330 may be determined in accordance with information that is publicly known or may be inferred about one or more opaque ranking metrics. Optimization ranking attributes 330 may affect the amount of juice passed via a link from a source to a target (as illustrated by links 255-56 in FIG. 2, discussed above). In other words, without optimization ranking attributes 330, every outbound link on a source may pass an equal amount of juice (as illustrated by links 220-21 in FIG. 2, discussed above). For example, optimization ranking attributes 330 may include some or all of the following non-exhaustive list of exemplary optimization ranking attributes 330:

- links that are deemed to be not "followable" (as in rel=nofollow, meta NOFOLLOW, and the like) might pass less juice (i.e., be valued lower) than links that are deemed to be followable;
- links that are followed (e.g., clicked) by Web users more frequently might pass more juice (i.e., be valued more highly) than links that are followed less frequently;
- paid links might pass less juice than non-paid links;
- a node may be analyzed at the block level and different types of links may be valued differently (e.g., links found in footers, navigational text, or in ad blocks may pass less juice than links found in content blocks or body text on a source node—links found "off-screen" might even be completely disregarded or pass no juice);
- links that target nodes within a domain ("internal links") may pass less juice than links that target nodes within a different domain (wherein, a "domain" may refer to a fully qualified domain, e.g., www.seomoz.com, or to a pay-level domain or domain parent, e.g., *.seomoz.com);
- links that target nodes hosted on the same IP address or same block of IP addresses might pass less juice than links that target nodes hosted on a different IP address or block of addresses;
- links that target nodes hosted on domains that are registered by the same or related entities might pass less juice than links that target nodes hosted on domains registered by unrelated entities;
- links that target "related" nodes (e.g., nodes that contain similar content to the source node or nodes that are related according to semantic analysis or some other measure) may pass more juice than links targeting unrelated nodes.

Figure 6:
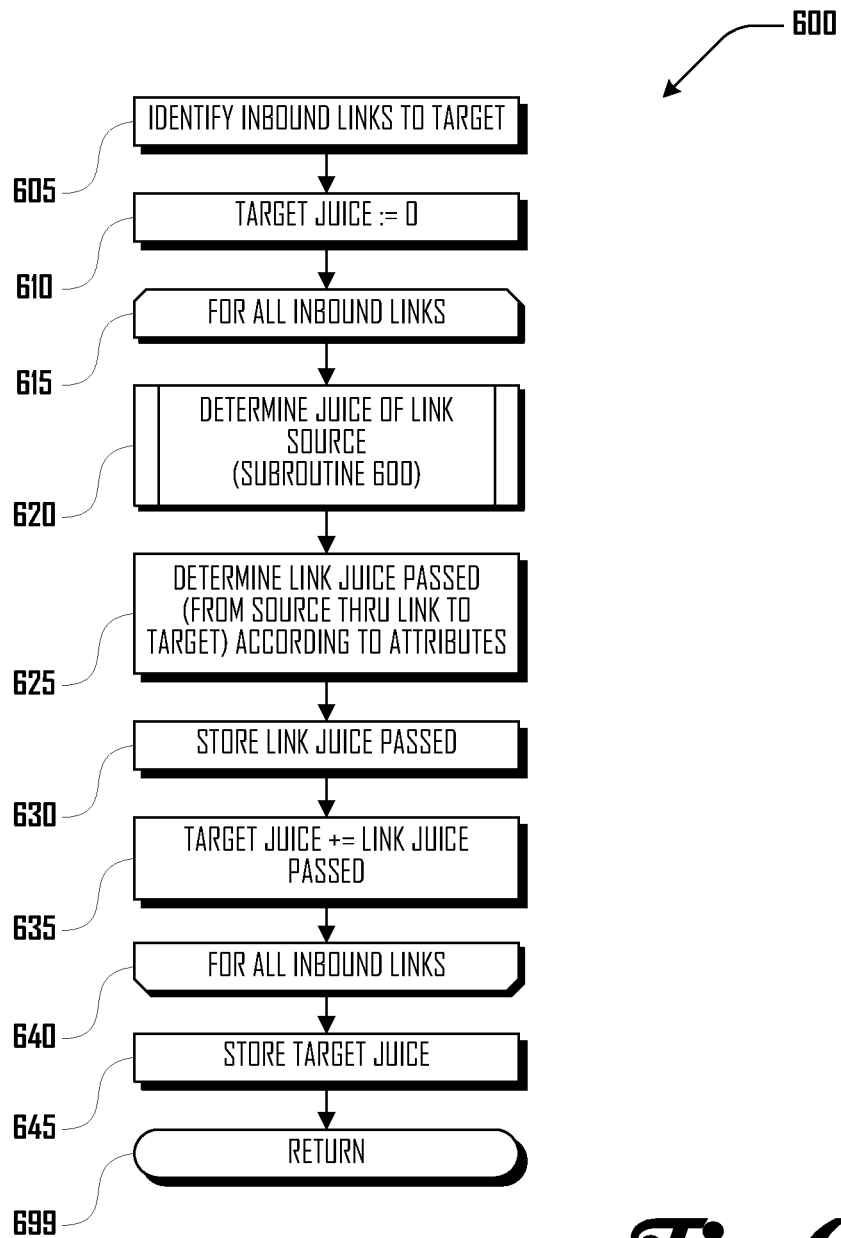
FIG. 6 is a flow diagram of an exemplary determine node juice value subroutine in accordance with one embodiment.

Once optimization ranking attributes 330 have been determined, the open index 305 may be analyzed to determine a juice value or authority metric or ranking for nodes appearing therein. From opening loop block 415 to closing loop block 425, some or all indexed nodes may be analyzed in determine-node-juice-value subroutine 600, as illustrated in FIG. 6 and discussed below, to determine a juice value for each analyzed node. As discussed below, additional data about links and nodes may also be determined and stored.

Once juice values and link data have been determined, this information may be used to analyze and optimize one or more target nodes. In block 430, a target node of interest is selected from the open index 305. In analyze and display node juice value subroutine 700, illustrated in FIG. 7 and discussed below, several optimization ranking attributes 330 may be analyzed to determine their respective contributions to the selected target node's total juice. These contributions may be displayed to enable a node provider to understand why his or her node ranks the way it does (i.e., understand various factors comprising the target node's juice value). FIGS. 9-12 illustrate how such data may be displayed in accordance with an exemplary embodiment. In block 440, a node operator and/or an optimization provider may use the displayed data to make the selected node appear more authoritative (i.e., to increase the selected node's juice value). Optimize routine 400 ends in block 499.

FIG. 5 illustrates a subroutine 500 for creating an open index in accordance with one embodiment. In block 505, a crawl list of nodes is obtained. In one embodiment, the crawl list represents a complete set of nodes to be inspected. In other embodiments, the crawl list may represent a set of "seed" nodes, with additional nodes being added to the crawl list as they are discovered. In one embodiment, the crawl list represents a subset of important or authoritative nodes within a larger corpus. For example, at the time of filing, an open index may contain from 10-25 billion targets in order to substantially approximate indices maintained by search providers.

Beginning in opening loop block 510, each node is inspected in turn. In block 512, the current node's content is requested and temporarily stored. In block 515, the current node content is analyzed, and a list of outbound links is extracted. Beginning in opening inner loop block 520, some or all of the outbound links are processed. In block 525, the destination or target node of the current outbound link is stored. In block 530, additional metadata about the link is stored. In one embodiment, such additional metadata may comprise one or more of a node title, anchor text, surrounding text, and the like. In closing inner loop block 535, the subroutine 500 cycles back to block 520 to process the next outbound link.

Once all outbound links on the current node have been inspected, some or all remaining node data may be discarded in block 540. In closing loop block 545, subroutine 500 cycles back to block 520 to process the next node. Once all nodes have been processed, routine 500 ends at block 599.

FIG. 6 illustrates an exemplary determine node juice value subroutine 600 for determining the total juice flowing into a target node in accordance with one embodiment. Subroutine 600 operates on a particular target node. In block 605, inbound links to the target node are identified. In one embodiment, a list of inbound links may be determined by inspecting the links list 315 in the open index 305. In other embodiments, the list of inbound links may be determined in any other suitable manner. In block 610, the juice value for the target node is initialized to 0. Beginning in opening loop block 615, some or all inbound links to the target node are analyzed to determine the amount of juice passed into the target node. In recursive subroutine 620, determine node juice value subroutine 600 is executed for the source node of the current link.

Once a juice value for the source node has been determined, links on the source node are analyzed in block 625 to determine the amount of the source node's juice that is passed to the target via the link ("link juice passed"), in accordance with the determined optimization attributes 330 (as discussed above in reference to FIG. 4). In block 630, the link juice passed metric is stored in association with the current link. In one embodiment, the link juice passed metric is stored in the link and/or node metadata list 335. In block 635, the current link's link juice passed is added to the target node's juice value. In closing loop block 640, subroutine 600 cycles back to block 615 to process the next inbound link. Once all inbound links have been processed, the target node's juice value has been determined, and it is stored in block 645. In one embodiment, it is stored in the node juice list 320. Subroutine 600 returns in block 699.

In practice, determining the juice passed into link destinations in the open index 305 requires numerous iterative passes over the entire open index 305. In at least one example implementation, it has been observed that juice values converge satisfactorily after approximately 40 iterations.

Figure 7:
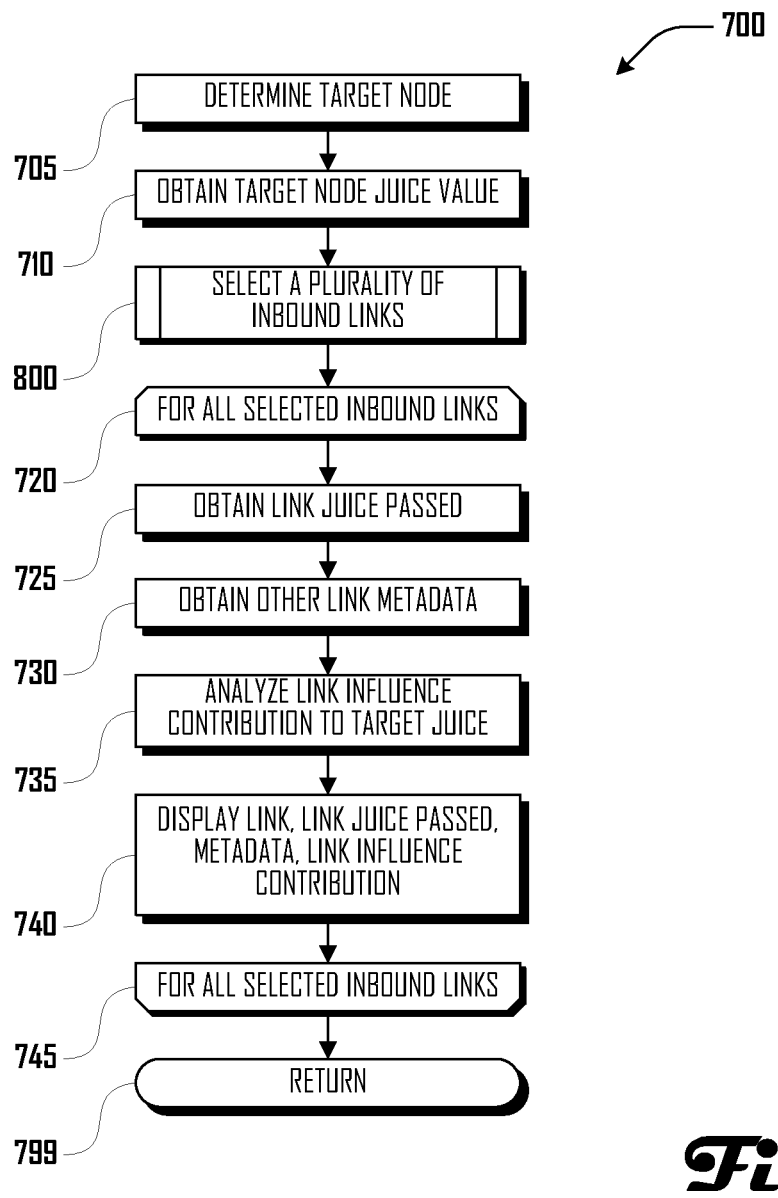
FIG. 7 is a flow diagram of an exemplary analyze and display node juice value subroutine in accordance with one embodiment.

FIG. 7 illustrates an exemplary analyze and display node juice value subroutine 700 that may be used to analyze and display data that influences a target node's juice value. Subroutine 700 begins in block 705, where a target node is determined to be of interest. In one embodiment, a node provider may identify a target by submitting an URL via a Web form. In block 710, the juice value of the target node is obtained. In one embodiment, the target juice value may be looked up in the node juice list 320. In block 800, one or more inbound links to the target node are determined to be of significance via inbound link selection subroutine 800 (see FIG. 8, discussed below). In one embodiment, inbound links are deemed "significant" if they pass a relatively substantial portion of juice into the target node. For example, in block 715, the 100 links that individually pass the most juice to the target node may be determined to be significant. Beginning in opening loop block 720, each significant link is processed. In block 725, the link juice passed value for the current significant inbound link is obtained. In one embodiment, the link juice passed value may be obtained from the link and/or node metadata list 335. In block 730, other metadata for the current significant inbound link is obtained. In various embodiments, such other metadata may be of interest because it may have influenced the link juice passed value. In one embodiment, other metadata may be obtained from the link and/or node metadata list 335.

In block 735, the current significant inbound link and its associated link juice passed and other metadata are analyzed to determine how and/or why the link passed the determined amount of juice to the target node. In block 740 some or all of the analyzed data are displayed. FIGS. 9-13 illustrate various exemplary screens displaying such information. In closing loop block 745, the subroutine 700 cycles back to opening loop block 720 to process the next significant inbound link. Once all significant inbound links have been processed, the routine ends at block 799.

Figure 8:
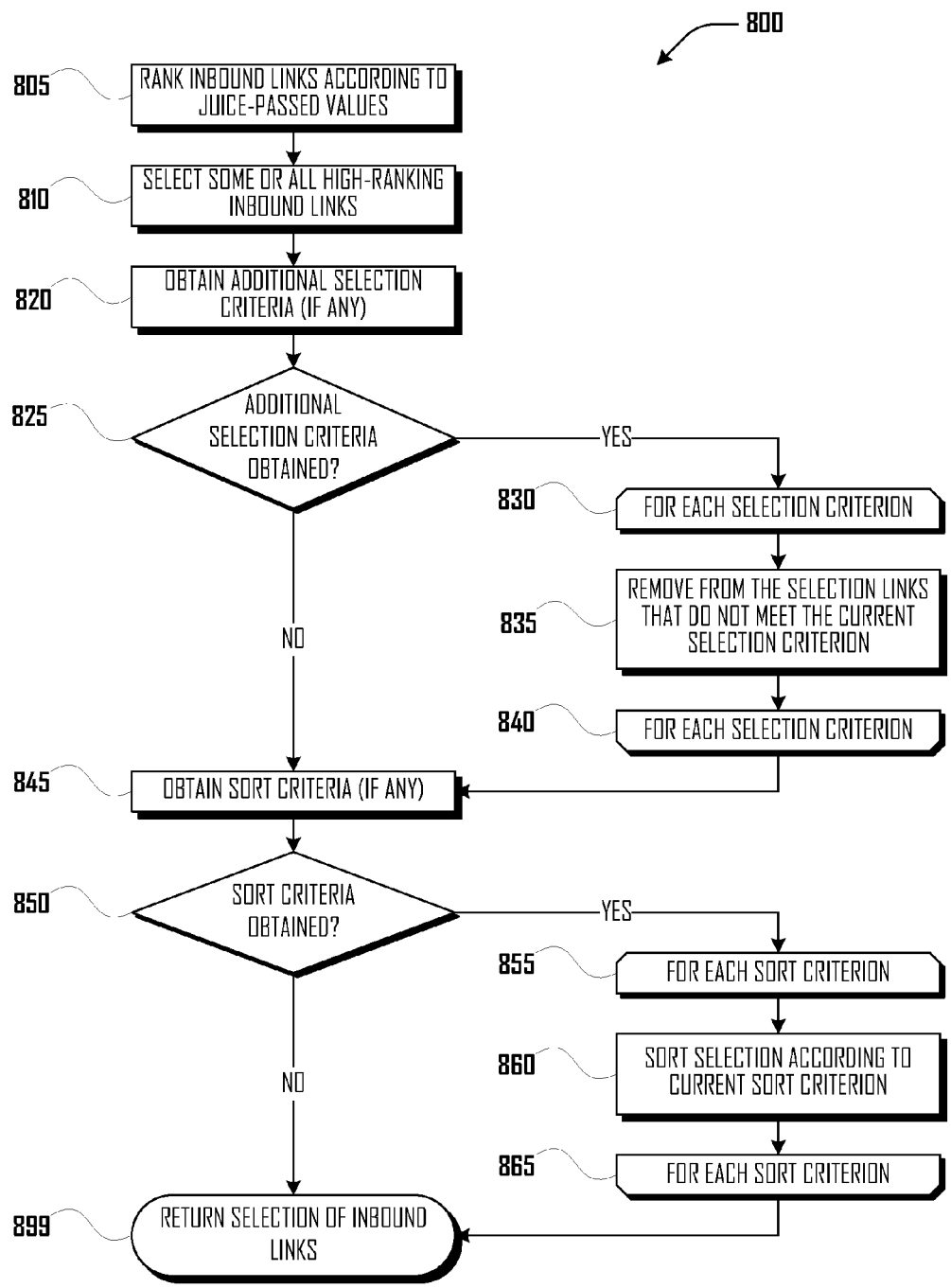
FIG. 8 is a flow diagram of an exemplary inbound link selection subroutine in accordance with one embodiment.

FIG. 8 illustrates an inbound link selection subroutine 800 in accordance with one embodiment. Subroutine 800 begins in block 805 by ranking inbound links to a target node according to their respective juice-passed values. In block 810, subroutine 800 selects some or all of the high-ranking inbound links. In one embodiment, the top N links may be selected. In other embodiments, some or all links having juice values higher than a threshold may be selected.

In block 820, subroutine 800 obtains additional search criteria (if any). For example, a user may submit additional search criteria, such as an image-link criterion (e.g., whether an inbound link's anchor text is an image); a redirect criterion (e.g., whether the inbound link targets the target node via an HTTP 301 or other 3xx status code, or via another redirect mechanism); a meta-refresh criterion (e.g., whether the inbound link targets the target page via an HTML meta element with the http-equiv parameter set to "refresh" and a content parameter including the target node's URL, or other refresh mechanism); a link-source-node attribute criterion (e.g., whether the source page of the inbound link is associated with a particular address, address block, fully qualified domain, pay-level domain, domain parent, and the like); a source-node content criterion (e.g., whether the source node of the inbound like is associated with particular content) and/or other like criteria.

If, in decision block 825, subroutine 800 determines that it obtained one or more additional search criteria, then subroutine 800 iterates over the additional search criteria beginning in loop block 830. In block 835, subroutine 800 removes from the selection (determined in block 810) inbound links that do not meet the current criterion. In block 840, subroutine 800 cycles back to block 830 to process the next additional search criterion (if any).

Once all additional search criteria (if any) have been processed, subroutine 800 obtains sort criteria (if any) in block 845. If, in decision block 850, subroutine 800 determines that it obtained one or more additional sort criteria, then subroutine 800 iterates over the additional sort criteria beginning in loop block 855. In block 860, subroutine 800 sorts the selection (determined in block 810 and possibly modified in blocks 830, 835, 845) of inbound links according to the current sort criterion. In block 865, subroutine 800 cycles back to block 855 to process the next sort criterion (if any).

Once all sort criteria (if any) have been processed, subroutine 800 returns the optionally sorted selection of inbound links at block 899.

FIGS. 9-13 illustrate various exemplary optimization data displays in accordance with an exemplary commercial embodiment, Linkscape, which is a service provided by SEOMoz Inc. of Seattle, Wash. (the current assignee of this application). Linkscape computes a number of link-based metrics in accordance with the principles discussed herein. These metrics relate to both nodes and domains, and measure several views of global authority or popularity, trust, spam, and freshness of data. More particularly, the Linkscape opaque ranking optimization system measures and publishes the contribution of a link to the end value of a node. In addition to metrics about end nodes, Linkscape also measures and publishes information about links. The metrics computed in this exemplary embodiment, and displayed as illustrated in FIGS. 9-13 are defined as follows.

mozRank refers to both a general, logarithmically scaled 10-point measure of global link authority or popularity (i.e., "juice") as well as variations on an iterative algorithm for measuring the value of individual links to a target node or domain, in addition to the end value of a node.

The mozRank measurement is applied to individual nodes using node-to-node links. However, the underlying algorithm can also be applied to the "domain-level link graph" to compute a Domain-Level mozRank. Doing so may offer additional insight about the general authority of the domain. Just as nodes can endorse other nodes, a link from one domain to another can be seen as endorsement by one domain for another. Domain-Level mozRank measures this, on a 10-point scale, in a manner similar to mozRank for nodes.

In addition to applying algorithms such as mozRank and mozTrust (discussed below) to the domain graph to get domain level metrics, domain statistics may be computed by aggregating node-level metrics of nodes in a domain. For instance, a metric called domain juice represents the sum of all mozRanks for nodes in a domain. Analogous domain-level metrics could be computed by summing other node level-metrics. Furthermore, domain statistics can also be computed by aggregating node level link statistics. For example, a metric called external domain juice represents the sum of all "mozRank passed" values for links from other domains to the given domain.

Just as links express global link popularity, so do they express something about the trustworthiness of a node. mozTrust is a quantitative measure of this trust. mozTrust leverages the notion of voting on the web. However, rather than allowing every node to initially vote, to compute mozTrust, only certain key, trustworthy sources of links are identified and allowed to initially vote. As in mozRank, votes are distributed through links. Consequently, nodes linked to by trustworthy sources are able to cast (smaller) votes of their own. It may also be possible to quantify the amount of mozTrust passed from an external link to the target node Just as mozRank can be applied to domain-to-domain links, so can mozTrust. Domain-Level mozTrust considers the trust garnered by all site-level endorsements. New, or poorly linked-to nodes on highly trusted domains may inherit some natural trust by virtue of being hosted on the trusted domain. In one embodiment, Domain-Level mozTrust is expressed on another 10-point logarithmic scale.

The "crawl freshness" reported for a url or domain reflects the degree to which the information in Linkscape's open index, specifically information about links, is up to date. Freshness may take into account how recently linking nodes were crawled, as well as the importance of those links to a target node or domain.

As illustrated in FIGS. 9-13, these and other metrics may be incorporated into sort able lists of link data to illustrate values of inbound links and to show how various contextual attributes influence the juice passed by a set of links. In other embodiments, similar optimization data could be displayed in a web browser toolbar.

Figure 9:
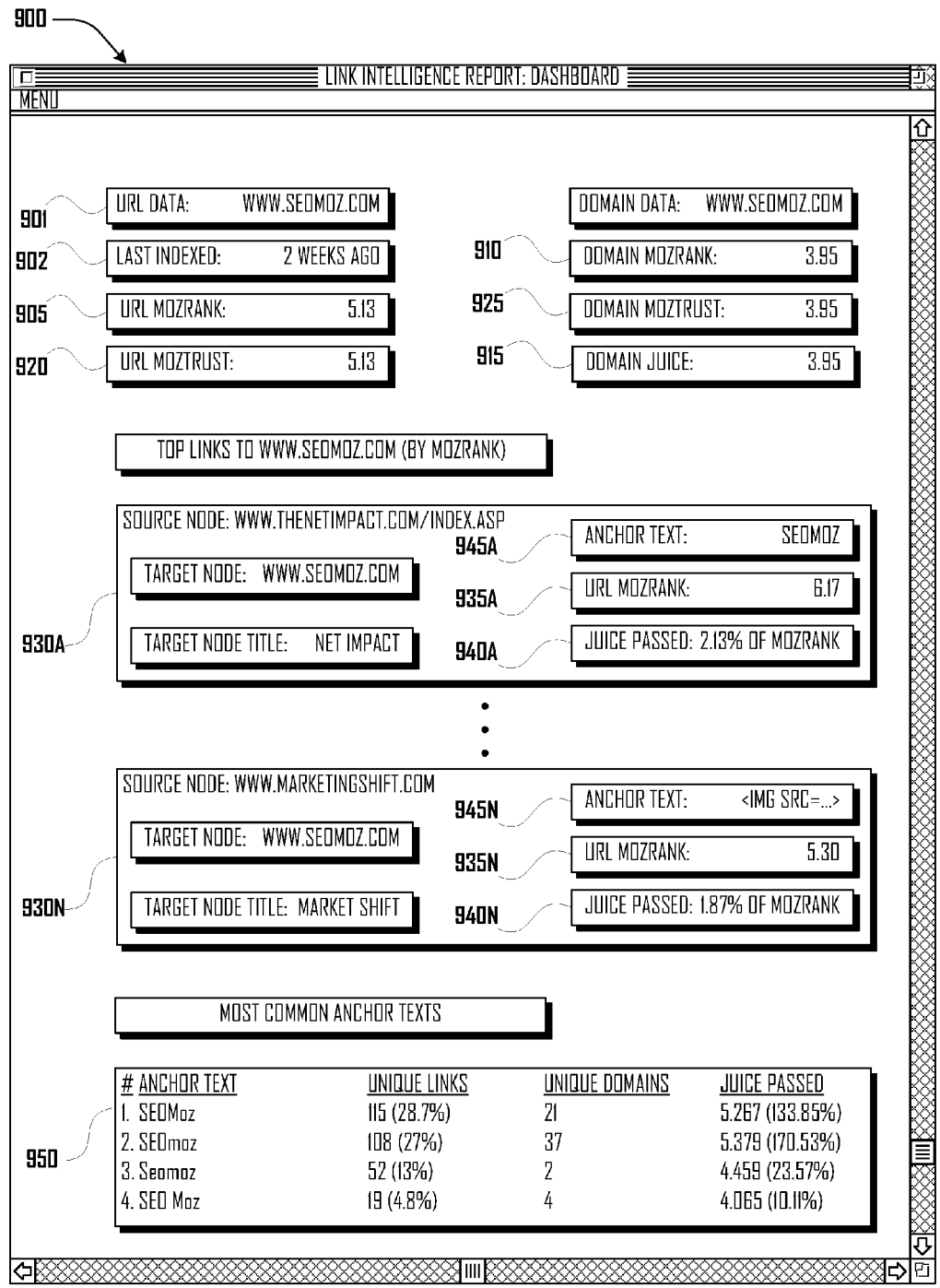
FIGS. 9-12 illustrate various exemplary optimization data displays in accordance with various embodiments.

FIG. 9 illustrates a "Dashboard" or overview of an optimization data display. In the illustrated embodiment, the dashboard presents numerous pieces of information related to a target node 901, including its mozRank 905, domain mozRank 910, mozTrust 920, domain mozTrust 925, domain juice 915, a freshness indicator 902, and the like. In addition, a number of the most significant inbound links 930A-N to the target are displayed, along with several pieces of metadata related to the significant inbound links, including the anchor text 945 of the inbound link, the mozRank 935 or juice of the source node, and the link juice passed 940 of the link. In addition, a list 950 of the 5 most common anchor texts is presented, along with other metadata related thereto.

Figure 10:
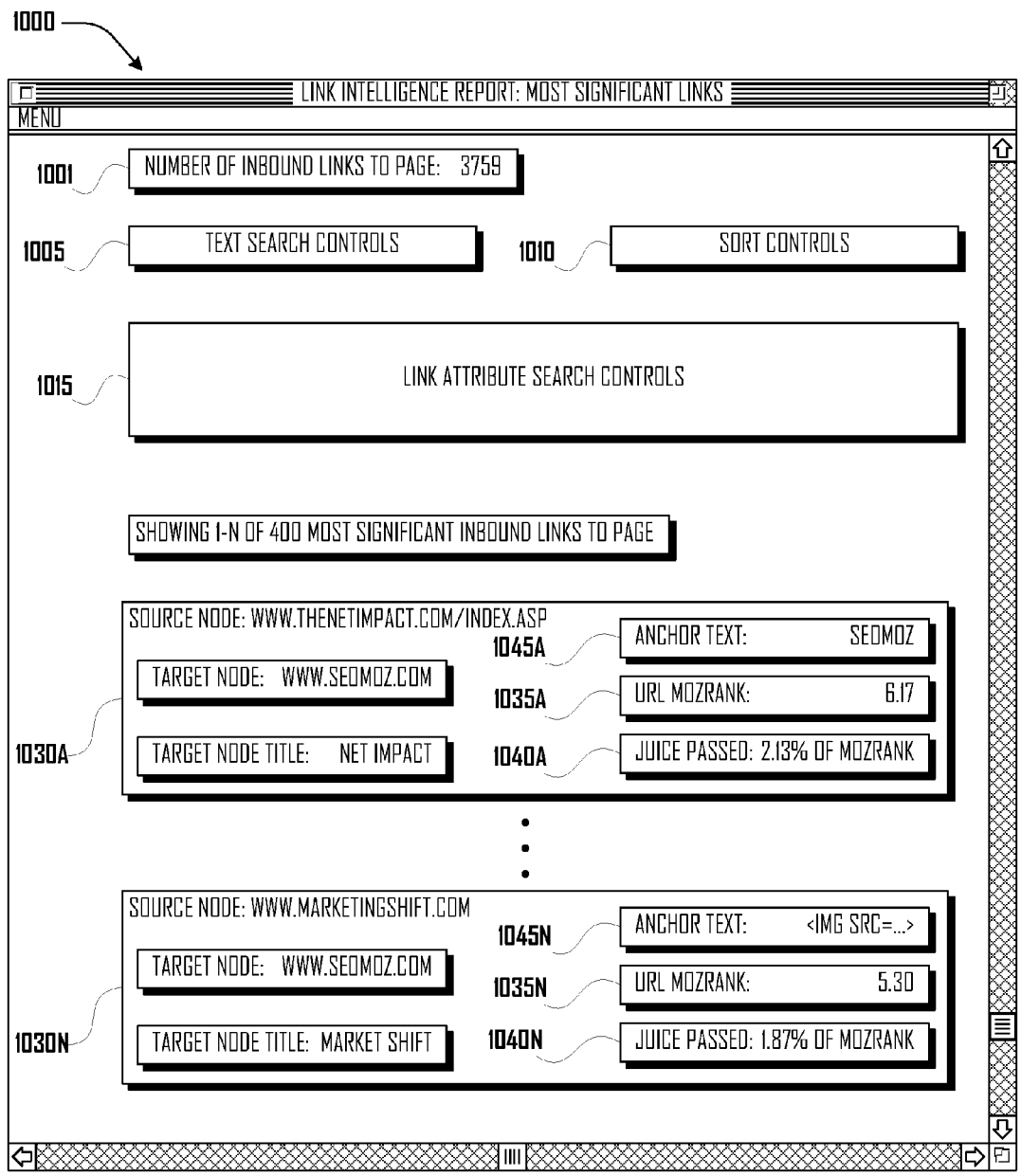

FIG. 10 illustrates an exemplary expanded view of most significant inbound links. Recognizing that many inbound links may be relevant to a target node's juice, the exemplary embodiment displays up to several hundred most significant inbound links 1030A-N, including search and sort facilities 1005, 1010, 1015.

Figure 11:
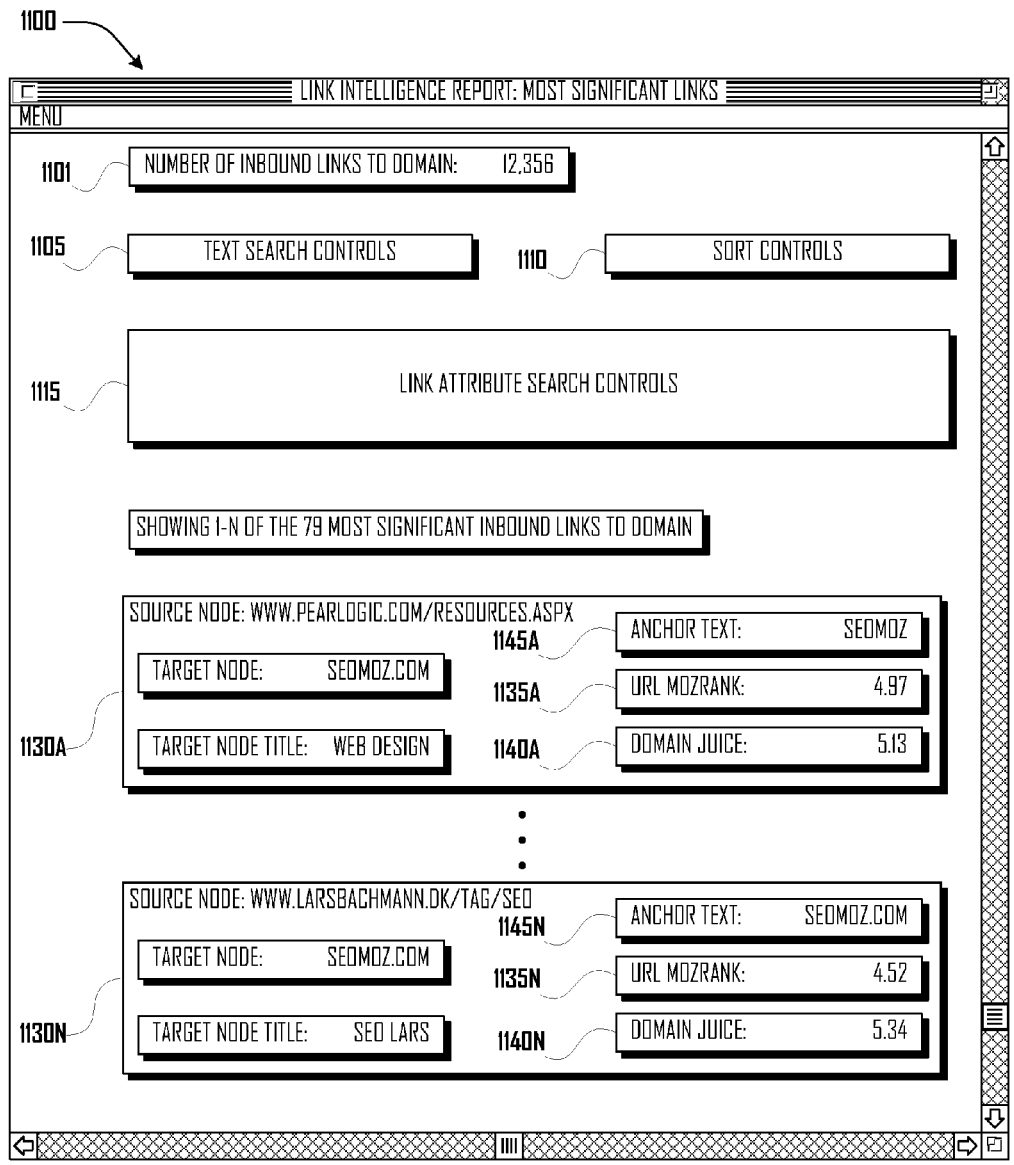

FIG. 11 illustrates a similar display 1100 to that of FIG. 10, but showing the most significant inbound links 1130A-N to the target's domain, along with search and sort facilities 1105, 1110, 1115.

Figure 12:
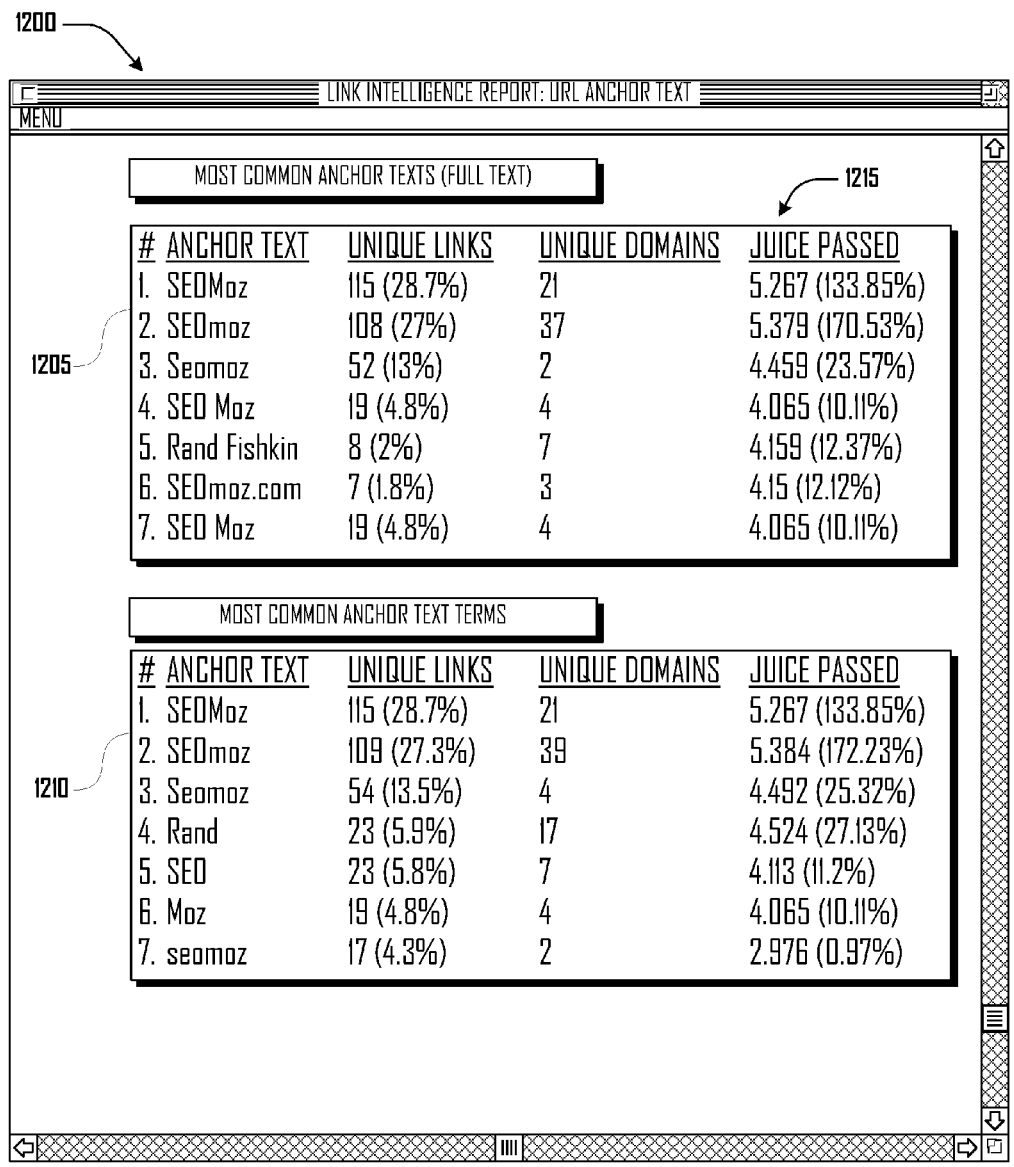

FIG. 12 illustrates an exemplary display 1200 showing the most common anchor texts (full text) 1205 and the most common anchor text terms 1210 that are used in significant inbound links. The list of most common anchor texts (full text) 1205 is sorted by a link juice passed metric 1215. A similar display (not shown) could show the most common anchor texts (full text) and the most common anchor text terms that are used in significant inbound links to the target node's domain. Alternate embodiments may identify and publish trends and/or common co-occurrences of words in anchor text.

Historical data similar to that illustrated in FIGS. 9-12 can also be presented to show how inbound link values have changed over time. Using similar methodologies, link analysis techniques can also be used prospectively, for example to help predict how a new site may interact with the Web given a proposed link graph. Such pre-launch testing may assist Web node providers to mitigate the risks associated with launching a new site. By revealing inbound link metadata, e.g., title tags, anchor text, and/or surrounding text, similar embodiments may allow a Web node operator to inspect and/or manage its online "reputation."

In other embodiments, historical data similar to that illustrated in FIGS. 9-12 may be presented to illustrate how metrics and links have changed over time. Web site operators may thus be able to correlate juice metrics with other data about their website (e.g., search traffic data). They may also be able to see how previous changes to their site and/or to other sites have affected their juice metrics. In one embodiment, metrics could be charted over time, and the chart may be able to display the links most responsible for a historical change in a metric (e.g., because the links were added, dropped, and/or because the juice passed along the links changed).

Still further embodiments may allow a Web site operator to evaluate hypothetical changes to the web graph. For example, a company could evaluate the effect of replacing a current website with a replacement website (thereby creating a hypothetical web) by computing juice metrics for this hypothetical web and making predictions about rankings. In one embodiment, the system may re-compute only juice metrics around the replacement website, while assuming that other metrics remain fixed. In other alternate embodiments, a node's juice value may be compared to an opaque rank in a closed index.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the embodiments discussed herein.

The invention claimed is:

1. A method executing on a computing system for exposing juice contributions indicative of a target juice value corresponding to a target node within a web of inter-linked nodes, the method comprising:
  obtaining a first index comprising a multiplicity of first-index node entries, said multiplicity of first-index node entries comprising a node entry corresponding to the target node and a plurality of other node entries corresponding to at least a representative sample of the web of inter-linked nodes;
  identifying via said first index a first plurality of inbound links targeting the target node;
  for each of said first plurality of inbound links:
    identifying via said first index a current source node corresponding to the current inbound link;
    obtaining via said first index a current-source-node juice value corresponding to the current source node; and
    determining, in accordance with a plurality of link-weighting factors, a current juice-passed value indicating a portion of said current-source-node juice value that contributes to said target-node juice value;

providing, from the computing system to a remote computing system, a plurality of juice-passed values determined for each of said first plurality of inbound links.

2. The method of claim 1, wherein obtaining via said first index said current-source-node juice value corresponding to the current source node comprises:

traversing at least a portion of said web of inter-linked nodes in accordance with said first index; and determining said current-source-node juice value in accordance with said plurality of link-weighting factors.

3. The method of claim 1, further comprising:

selecting, from among said first plurality of inbound links, a second plurality of significant inbound links in accordance with said juice-passed values determined for each of said plurality of inbound links; and providing link metadata associated with said second plurality of significant inbound links from the computing system to said remote computing system.

4. The method of claim 3, wherein selecting said second plurality of significant inbound links comprises:

ranking said first plurality of inbound links according to their respective juice-passed values; and identifying inbound links that rank highly.

5. The method of claim 3, wherein selecting said second plurality of significant inbound links comprises:

grouping said first plurality of inbound links into a plurality of link groups according to a link metadata criterion;

determining an aggregate juice-passed value for each of said plurality of link groups;

ranking said plurality of link groups according to their respective aggregate juice-passed values; and identifying link groups that rank highly.

6. The method of claim 1, further comprising:

obtaining a user-provided selection criterion;

selecting, from among said first plurality of inbound links, a second plurality of selected inbound links in accordance with said user-provided selection criterion; and providing link metadata associated with said second plurality of selected inbound links from the computing system to said remote computing system.

7. The method of claim 6, wherein said user-provided selection criterion comprises at least one of an image-link criterion, a redirect criterion, a meta-refresh criterion, a link-source-node attribute criterion, and a source-node content criterion.

8. The method of claim 1, further comprising providing, from the computing system to a remote computing system, at least one of a count of said first plurality of inbound links and a freshness indication associated with at least one first-index entry associated with the target node.

9. The method of claim 1, further comprising:

identifying via said first index a first plurality of outbound links sourced from the target node; and for each of said plurality of outbound links:

identifying via said first index a current outbound-target node corresponding to the current outbound link;

identifying via said first index a current outbound-target-node juice value corresponding to the current outbound-target node; and determining, in accordance with said plurality of link-weighting factors, a contribution value indicating a positive or negative contribution to said target-node juice value, said contribution value being associated with the current outbound link.

10. The method of claim 9, wherein obtaining a first index comprising a multiplicity of first-index node entries comprises creating said first index to overlap a closed index, said closed index comprising a plurality of closed-index node entries and a corresponding plurality of closed-index juice values, and wherein said plurality of link-weighting factors are indicative of said plurality of closed-index juice values.

11. The method of claim 10, wherein said first index further comprises:

a plurality of link entries, each link entry indicating a source one of the plurality of first-index node entries and a target one of the plurality of first-index node entries; and a plurality of link metadata entries corresponding to said plurality of link entries.

12. The method of claim 11, wherein creating said first index overlapping said closed index comprises:

for each of a plurality of nodes:

recording a node entry corresponding to the current node;

obtaining content data corresponding to the current node, said content data including one or more outbound links and a plurality of non-link content data;

for each outbound link:

recording a link entry indicating the current node and a target node; and recording a link metadata entry corresponding to the current outbound link.

13. The method of claim 12, wherein creating said first index overlapping said closed index further comprises discarding at least a majority of said non-link content data.

14. A non-transitory computer-readable storage medium having stored thereon instructions that, when executed by a processor, perform the method of claim 1.

15. A computing apparatus comprising a processor and a memory, the memory storing instructions that, when executed by the processor, perform the method of claim 1.

* * * * *